United States Patent
Risaki et al.

(10) Patent No.: US 8,803,231 B2
(45) Date of Patent: Aug. 12, 2014

(54) TRENCH MOS TRANSISTOR AND METHOD OF MANUFACTURING THE SAME

(75) Inventors: Tomomitsu Risaki, Chiba (JP); Jun Osanai, Chiba (JP)

(73) Assignee: Seiko Instruments, Inc., Chiba (JP)

( * ) Notice: Subject to any disclaimer, the term of this patent is extended or adjusted under 35 U.S.C. 154(b) by 192 days.

(21) Appl. No.: 13/438,058

(22) Filed: Apr. 3, 2012

(65) Prior Publication Data
US 2012/0187476 A1 Jul. 26, 2012

Related U.S. Application Data

(62) Division of application No. 12/027,655, filed on Feb. 7, 2008, now Pat. No. 8,168,494.

(30) Foreign Application Priority Data

Feb. 7, 2007 (JP) ................................. 2007-028294

(51) Int. Cl.
*H01L 29/78* (2006.01)
*H01L 21/336* (2006.01)

(52) U.S. Cl.
USPC ........... 257/330; 257/343; 257/401; 257/611; 257/E29.091; 438/259; 438/284

(58) Field of Classification Search
CPC ................................................ H01L 29/66621
USPC .......... 257/343, 611, E29.091, 330; 438/259, 438/284, 302, 306, 389, 524, 525, 589
See application file for complete search history.

(56) References Cited

U.S. PATENT DOCUMENTS

| | | | |
|---|---|---|---|
| 4,769,686 A | 9/1988 | Horiuchi et al. |
| 4,835,585 A | 5/1989 | Panousis |
| 4,979,004 A | 12/1990 | Esquivel et al. |
| 5,371,024 A | 12/1994 | Hieda et al. |

(Continued)

FOREIGN PATENT DOCUMENTS

| JP | 05-160401 | 6/1993 |
|---|---|---|
| JP | 05160401 A * | 6/1993 |
| JP | 2006-294645 A | 10/2006 |

OTHER PUBLICATIONS

Office Action from co-pending U.S. Appl. No. 12/178,328, dated Jun. 24, 2009, 16 pages.

(Continued)

*Primary Examiner* — Alexander Sofocleous
*Assistant Examiner* — John P Dulka
(74) *Attorney, Agent, or Firm* — Brinks Gilson & Lione

(57) ABSTRACT

Trench portions (10) are formed in a well (5) in order to provide unevenness in the well (5). A gate electrode (2) is formed via an insulating film (7) on the upper surface and inside of the trench portions (10). A source region (3) is formed on one side of the gate electrode (2) in a gate length direction while a drain region (4) on another side. Both of the source region (3) and the drain region (4) are formed down to near the bottom portion of the gate electrode (2). By deeply forming the source region (3) and the drain region (4), current uniformly flows through the whole trench portions (10), and the unevenness formed in the well (5) increases the effective gate width to decrease the on-resistance of a semiconductor device 1 and to enhance the drivability thereof.

5 Claims, 8 Drawing Sheets

(56) References Cited

U.S. PATENT DOCUMENTS

| | | | |
|---|---|---|---|
| 6,201,278 | B1 | 3/2001 | Gardner et al. |
| 6,452,231 | B1 | 9/2002 | Nakagawa et al. |
| 6,501,146 | B1 | 12/2002 | Harada |
| 8,168,494 | B2 * | 5/2012 | Risaki et al. ................ 438/259 |
| 8,236,648 | B2 * | 8/2012 | Hashitani ..................... 438/259 |
| 2002/0179980 | A1 | 12/2002 | Yagishita et al. |
| 2004/0155259 | A1 | 8/2004 | Taniguchi et al. |
| 2005/0285210 | A1 * | 12/2005 | Ishibashi et al. ............ 257/391 |
| 2006/0001085 | A1 | 1/2006 | Risaki |
| 2006/0001110 | A1 * | 1/2006 | Igarashi ....................... 257/401 |
| 2006/0154440 | A1 | 7/2006 | Lanzerotti et al. |
| 2006/0223253 | A1 * | 10/2006 | Risaki .......................... 438/197 |
| 2007/0249123 | A1 | 10/2007 | Chou et al. |
| 2008/0109770 | A1 | 5/2008 | Kim et al. |

OTHER PUBLICATIONS

Office Action from co-pending U.S. Appl. No. 12/178,328, dated Dec. 10, 2009, 17 pages.

Office Action from co-pending U.S. Appl. No. 12/178,328, dated Mar. 1, 2011, 18 pages.

* cited by examiner

Prior Art

TRENCH MOS TRANSISTOR AND METHOD OF MANUFACTURING THE SAME

This application is a divisional of U.S. patent application Ser. No. 12/027,655, filed Feb. 7, 2008, now U.S. Pat. No. 8,168,494, which claims priority under 35 U.S.C. §119 to Japanese Patent Application No. JP2007-028294 filed Feb. 7, 2007, the entire contents of each of which is hereby incorporated by reference

RELATED ART

The present invention relates to a semiconductor device and a method of manufacturing the semiconductor device such as a MOS transistor.

BACKGROUND OF THE INVENTION

Downsizing and drivability enhancement of a MOS transistor are important issues since the MOS transistor is an electronic device locating at the core of electronic technology.

One method to enhance the drivability of a MOS transistor is to make a gate width larger to decrease the on-resistance. However, enlargement of the gate width has a problem that the occupied area by the MOS transistor becomes larger.

Japanese Patent Application Laid-open No. 2006-294645 proposes a technique to make the gate width larger while increase in the occupation area of a MOS transistor having lateral MOS structure is suppressed.

In this technique, as illustrated in a perspective view of FIG. 8A, trench portions 10 are provided in a well 5, and a gate electrode 2 is formed on the upper surface and inside of the trench portions 10 via an insulating film 7.

On a surface of the well 5, a source region 61 is provided on one side of the gate electrode 2 while a drain region 62 is provided on the other side of the gate electrode 2.

FIG. 8B is a sectional view taken along the line A-A in FIG. 8A. As illustrated in FIG. 8B, the length of the edge in contact with the insulating film 7 becomes the gate width because the gate electrode 2 is formed in the trench portions 10.

In this way, according to this technique, by forming a gate portion in the shape of a trench structure having convex portions and concave portions, the effective gate width can be made larger in relation to the length of the gate electrode 2 on the surface, and thus, the on-resistance per unit area can be decreased without lowering the withstanding voltage of the MOS transistor.

However, the structure illustrated in FIG. 8A has a problem in that, as a gate length L becomes smaller, desired drivability becomes more difficult to obtain.

FIG. 8C is a sectional view taken along the line B-B in FIG. 8A. As can be easily understood with reference to FIG. 8B, FIG. 8C is a sectional view taken along a line which is quite close to the side wall of the trench where a channel region 12 is formed. Current flows along a current path 13 in the channel region 12 generated between the source and the drain illustrated in FIG. 8C. The current path 13 is shorter in an upper portion of the channel region 12 than in a lower portion of the channel region 12, and, the shorter the gate length L becomes, the more outstanding the difference becomes. More specifically, the shorter the gate length L becomes, the more intensively current flows along the current path 13 in the upper portion of the channel region 12, and almost no current flows along the current path 13 in the lower portion, and thus, there is a problem that the channel region 12 can not be effectively used and desired drivability can not be obtained.

SUMMARY OF THE INVENTION

An object of the present invention is to improve the drivability of a semiconductor device having a trench structure.

In order to achieve the above-mentioned object, according to a first aspect of the present invention, there is provided a semiconductor device, including: a semiconductor substrate; a well of a first conductivity type which is formed on the semiconductor substrate, the well having a concave portion formed therein with varying depth in a gate width direction; a gate electrode formed on the upper surface and inside of the concave portion via an insulating film; a source region of a second conductivity type formed on one side of the gate electrode up to near a bottom portion of the gate electrode; and a drain region of the second conductivity type formed on another side of the gate electrode up to near the bottom portion of the gate electrode.

According to a second aspect of the present invention, in the semiconductor device according to the first aspect of the present invention, bottom portions of the source region and the drain region are formed at one of a position as deep as the bottom portion of the gate electrode and a position deeper than the bottom portion.

According to a third aspect of the present invention, in the semiconductor device according to the first or second aspect of the present invention, a bottom portion side of the source region and the drain region is formed by a well of the second conductivity type.

According to a fourth aspect of the present invention, in the semiconductor device according to the first, second, or third aspect of the present invention, an impurity concentration of a portion of the drain region which is adjacent to the gate electrode is set to be low.

According to a fifth aspect of the present invention, there is provided a method of manufacturing a semiconductor device, including: a well forming step of forming a well of a first conductivity type on a semiconductor substrate; a concave portion forming step of forming a concave portion in the well, with varying depth in a gate width direction; a gate electrode forming step of forming, after forming an insulating film on the concave portion, a gate electrode on the upper surface and inside of the concave portion via the insulating film; and a source and drain forming step of implanting ions into both sides of the gate electrode to form a source region and a drain region up to near a bottom portion of the gate electrode.

According to a sixth aspect of the present invention, there is provided a method of manufacturing a semiconductor device, including: a well forming step of forming a well of a first conductivity type on a semiconductor substrate; a second well forming step of forming two wells of a second conductivity type in the well of the first conductivity type; a concave portion forming step of forming a concave portion between the two wells of the second conductivity type, with varying depth in a gate width direction; a gate electrode forming step of forming, after forming an insulating film on the concave portion, a gate electrode on the upper surface and inside of the concave portion via the insulating film; and a source and drain forming step of implanting ions into the two wells of the second conductivity type to form a source region and a drain region.

According to a seventh aspect of the present invention, in the method of manufacturing a semiconductor device according to the sixth aspect of the present invention, the second well forming step includes implanting ions to a portion of a single well of the second conductivity type to convert the portion to the first conductivity type and to separately form the single well of the second conductivity type.

According to the present invention, by forming the source region and the drain region up to near the bottom portion of the gate electrode, the drivability of the semiconductor device can be improved.

Figure 1:
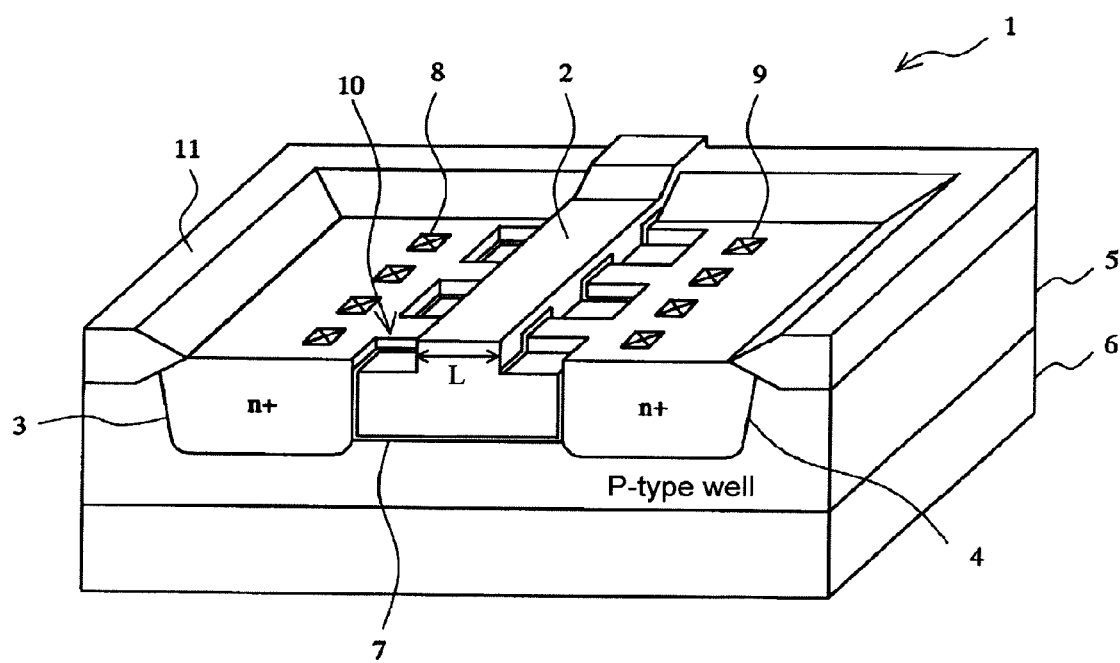
FIG. 1 is a view for explaining a structure of a semiconductor device of Embodiment.

DETAILED DESCRIPTION OF THE PREFERRED EMBODIMENT (1) Overview of Embodiment

Trench portions 10 are formed in a well 5 (FIG. 1) in a gate width direction in order to provide unevenness in the well 5. A gate electrode 2 is formed on the upper surface and inside of the trench portions 10 via an insulating film 7. A source region 3 is formed on one side of the gate electrode 2 in a gate length direction while a drain region 4 is formed on the other side of the gate electrode 2. Both of the source region 3 and the drain region 4 are formed down to near a bottom portion of the gate electrode 2 (down to near the bottom portions of the trench portions 10). By deeply forming the source region 3 and the drain region 4 in this way, current which otherwise intensively flows along a shallow portion of the gate electrode 2 uniformly flows through the whole trench portions 10, and the unevenness formed in the well 5 increases the effective gate width. Therefore, the on-resistance of a semiconductor device 1 is decreased and the drivability thereof is enhanced.

(2) Detail of Embodiment

FIG. 1 is a view for explaining a structure of the semiconductor device of the present embodiment.

The semiconductor device 1 is a MOS transistor having a lateral MOS structure. The well 5 is formed on a semiconductor substrate 6, and further, the gate electrode 2, the source region 3, and the drain region 4 are formed in the well 5.

These elements are electrically isolated by local oxidation of silicon (LOCOS) 11 from other regions of the semiconductor substrate 6.

The well 5 is formed to be of a first conductivity type while the source region 3 and the drain region 4 are formed to be of a second conductivity type.

When the first conductivity type is a p-type semiconductor, the second conductivity type is an n-type semiconductor. When the first conductivity type is an n-type semiconductor, the second conductivity type is a p-type semiconductor.

In the semiconductor device 1 illustrated in FIG. 1, the first conductivity type is p-type and the second conductivity type is n-type. The well 5 is formed of a p-type semiconductor and the source region 3 and the drain region 4 are formed of an n-type semiconductor. In the figures, in order to clearly distinguish between p-type and n-type, a well of the p-type is indicated as "p-type well", for example.

Although, in the present embodiment, the semiconductor device 1 has the above-mentioned structure, the first conductivity type may be n-type and the second conductivity type may be p-type. In that case, the well 5 is formed of an n-type semiconductor and the source region 3 and the drain region 4 are formed of a p-type semiconductor.

The plurality of trench portions 10 which are concave portions are formed in the well 5 in the gate width direction, which changes the depth of the well 5 in the gate width direction.

The direction between the source region 3 and the drain region 4 (L in the figure) is the gate length direction, and the direction in parallel with the surface of the semiconductor device 1 and perpendicular to L is the gate width direction.

It is to be noted that, although, in the present embodiment, the plurality of trench portions 10 are formed, only one trench portion 10 may be formed.

The insulating film 7 made of $SiO_2$, for example, is formed on the upper surface and inside of the trench portions 10, that is, on a surface where the gate electrode 2 faces the well 5.

The gate electrode 2 made of polysilicon or the like is formed on the upper surface and inside of the trench portions 10 via the insulating film 7.

Figure 8A:
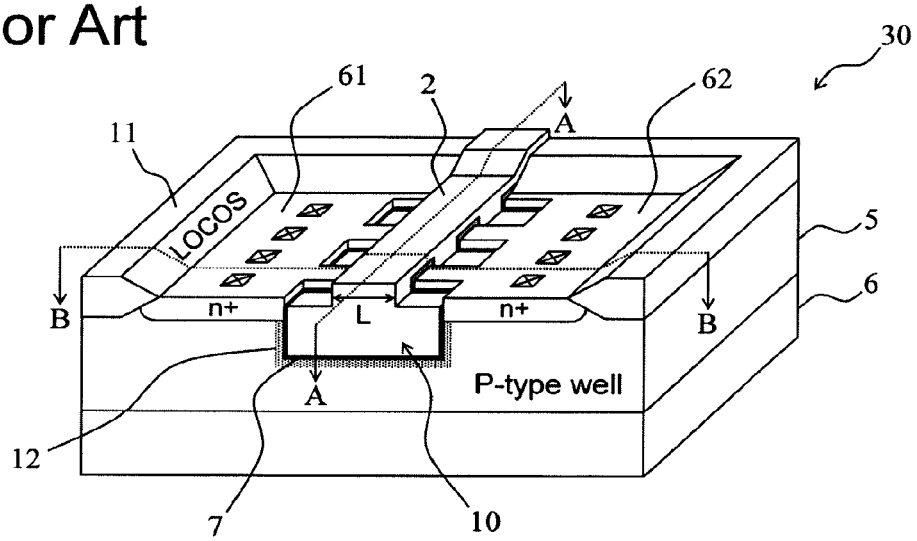
FIG. 8 is views for explaining a conventional semiconductor device.
Figure 8B:
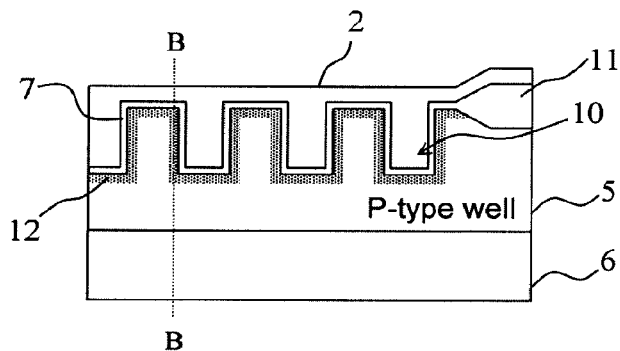
Figure 8C:
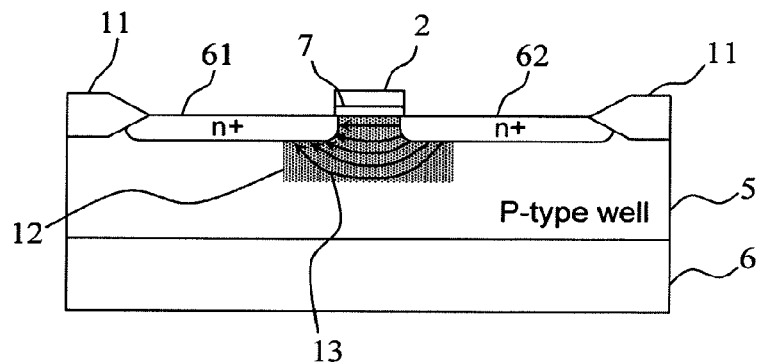

The structure of the trench portions 10 and the gate electrode 2 is similar to that in the conventional case illustrated in FIGS. 8A-8C.

The source region 3 formed of an n-type semiconductor is formed on one side region of the gate electrode 2 in the gate length direction while the drain region 4 formed of an n-type semiconductor is formed on the other side of the gate electrode 2.

The bottom portions of the source region 3 and the drain region 4 reach the vicinity of the bottom portion of the gate electrode 2 (which also can be referred to as the vicinity of the bottom portions of the trench portions 10).

A plurality of contacts 8 are formed in the source region 3 while a plurality of contacts 9 are formed in the drain region 4 so as to be connected to an external circuit.

Indication of "n+" in the figures means that the concentration of the n-type is high (that is, the concentration of the impurity is high). When the concentration is low, indication of "n−" is used.

It is to be noted that, in the case of an n-type semiconductor, arsenic ions, phosphorus ions, or the like is used as the impurity, and, in the case of a p-type semiconductor, boron ions or the like is used.

By forming the source region 3 and the drain region 4 up to near the bottom portion of the gate electrode 2 in this way, even when the gate length becomes small, the amount of current which flows along the current path 13 in the lower portion of the channel region 12 illustrated in FIG. 8C is increased, and thus, the effective gate width can be made larger.

This makes it possible to improve the drivability of the semiconductor device 1 while increase in the occupation area of the semiconductor device 1 is suppressed.

In the present embodiment, the source region 3 and the drain region 4 are formed down to near the bottom portion of the gate electrode 2. The vicinity is preferably in the range of ±20% in depth from the bottom portion of the gate electrode 2 (the bottom portions of the trench portions 10), and more preferably in the range of ±10%.

In order to obtain without fail the effect achieved by deepening the source region 3 and the drain region 4, the bottom portions of the source region 3 and the drain region 4 are preferably as deep as or deeper than the bottom portion of the gate electrode 2 (the bottom portions of the trench portions 10).

Next, a method of manufacturing the semiconductor device 1 is described.

For manufacturing the semiconductor device 1, first, the LOCOS 11 and the well 5 are formed on the semiconductor substrate 6. Then, trench portions 10 are formed in the well 5 by etching or the like. Then, the insulating film 7 is formed on the upper surface and inside of the well 5, and the gate electrode 2 is formed thereon. Finally, the source region 3 and the drain region 4 are formed by ion implantation.

The manufacturing method described in the above is similar to a conventional method of manufacturing a semiconductor device except that energy used in ion implantation of the source region 3 and the drain region 4 is enhanced.

Carriers of the semiconductor device 1 illustrated in FIG. 1 are electrons and the semiconductor device 1 is an n-channel semiconductor device. In this case, phosphorus (P) is preferable for the impurity in ion implantation of the source region 3 and the drain region 4, compared with conventionally used arsenic (As) since phosphorus (P) is fast to diffuse thermally.

When the semiconductor device 1 is a p-channel semiconductor device where carriers are holes (when the well 5 is of an n-type and the source region 3 and the drain region 4 are of a p-type), boron (B) is preferable for the impurity compared with conventionally used boron difluoride ($BF_2$) since boron (B) is more deeply implanted with the same implantation energy.

The present embodiment described in the above can obtain the following effects.

(1) By forming the gate electrode 2 in the trench portions 10 to have a trench structure, the effective gate width can be made larger.

(2) By deeply forming the bottom portions of the source region 3 and the drain region 4 so as to reach the vicinity of the bottom portion of the gate electrode 2, intensiveness of current passing through a shallow portion in the trench structure can be alleviated, and thus, increase in the effective gate width can be realized by the trench structure.

(3) By deeply forming the bottom portions of the source region 3 and the drain region 4 so as to reach the vicinity of the bottom portion of the gate electrode 2, even when the gate length is small, intensiveness of current flows along a shallow portion in the trench structure can be alleviated.

(4) Because the effective gate width can be made larger, the on-resistance is decreased and the drivability of the semiconductor device 1 can be enhanced.

(5) A complementary metal oxide semiconductor (CMOS) structure having high drivability in a single chip can be constructed.

As described in the above, in the semiconductor device 1, the well 5 works as a well of the first conductivity type formed on the semiconductor substrate 6 and having concave portions (the trench portions 10) formed therein with varying depth in the gate width direction.

The gate electrode 2 is formed on the upper surface and inside of the concave portions via the insulating film 7. The source region 3 works as a source region of the second conductivity type which is formed on one side of the gate electrode 2 up to near the bottom portion of the gate electrode 2, and the drain region 4 works as a drain region of the second conductivity type which is formed on the other side of the gate electrode 2 up to near the bottom portion of the gate electrode 2.

Further, it is effective to form the bottom portions of the source region 3 and the drain region 4 so as to be as deep as or deeper than the bottom portion of the gate electrode 2.

It is to be noted that, although, in the semiconductor device 1, the first conductivity type is p-type, the second conductivity type is n-type, and the semiconductor device 1 is an n-channel semiconductor device, the first conductivity type may be n-type, the second conductivity type may be p-type, and the semiconductor device 1 may be a p-channel semiconductor device.

(Variation 1)

While boron or the like can be easily implanted deep into the well 5 with high implantation energy, it is sometimes difficult to implant arsenic, phosphorus, or the like deep into the well 5.

Therefore, in the present variation, second wells which work as the source region 3 and the drain region 4 are formed in the well 5. Because, in forming the second wells, ions diffuse thermally, the ions can be distributed deep into the well 5.

Figure 2:
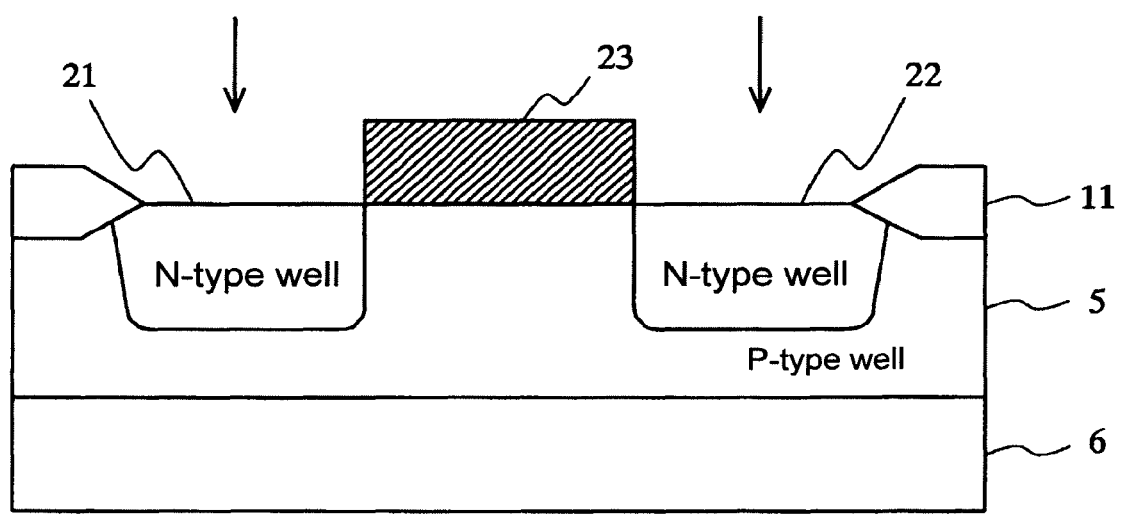
FIG. 2 is a view for explaining a method of manufacturing second wells.

First, a method of forming the second wells is described with reference to FIG. 2.

After LOCOS 11 and a p-type well 5 are formed on a semiconductor substrate 6, a mask is formed with a resist 23 on an upper surface of the well 5 such that a surface where a source region and a drain region are to be formed thereon is exposed.

Ions such as arsenic or phosphorus are implanted from the upper surface and heat treatment is carried out to form n-type second wells 21 and 22 in regions where a source region and a drain region are to be formed. It is to be noted that, in the figure, in order to clarify that the conductivity type is n-type, indication of "n-type well" is used.

Similarly to the case of the semiconductor device 1, bottom portions of the second wells 21 and 22 are formed in the vicinity of a bottom portion of a gate electrode 2 to be formed later.

By implanting ions corresponding to the n-type into the second wells 21 and 22 which are formed in this way, a source region and a drain region are formed.

Figure 3:
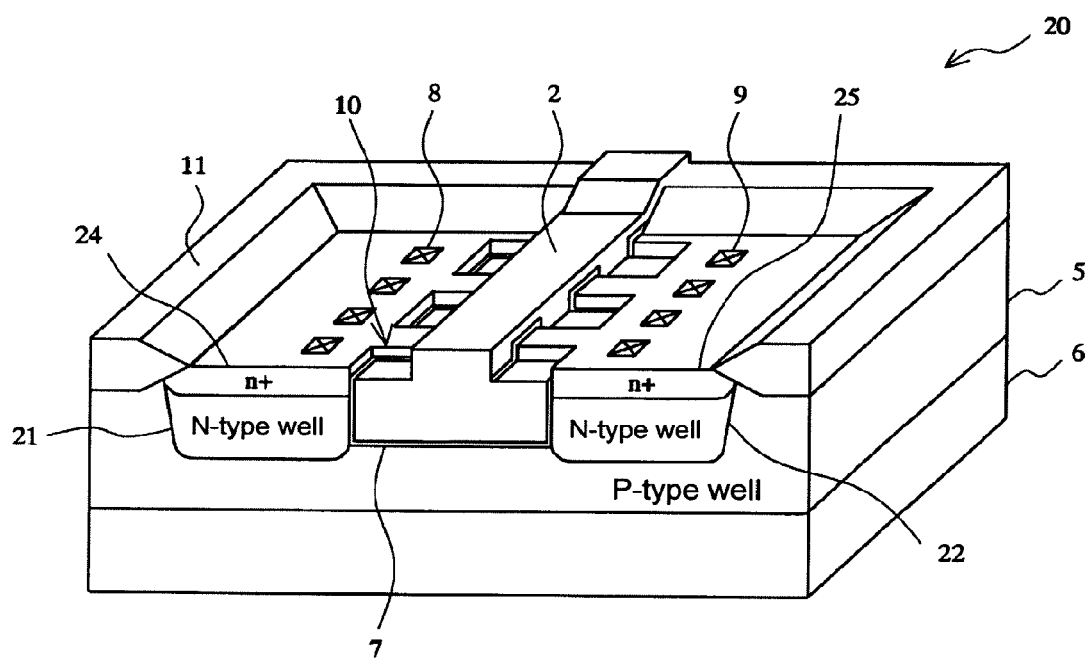
FIG. 3 is a view for explaining a structure of a semiconductor device according to Variation 1.

FIG. 3 is a view for explaining a structure of a semiconductor device according to Variation 1.

A semiconductor device 20 is similar to the semiconductor device 1 except that the structure of the source region and the drain region is different.

Ions are implanted into upper surface portions of the second wells 21 and 22, an n+ region 24 is formed on the second well 21, and an n+ region 25 is formed on the second well 22.

Contacts 8 are formed in the n+ region 24 while contacts 9 are formed in the n+ region 25.

The second well 21 and the n+ region 24 as a whole work as a source region while the second well 22 and the n+ region 25 as a whole work as a drain region.

In this way, when ion implantation down to near the bottom portion of the gate electrode 2 is difficult, by forming the second well 21 and the second well 22, the source region and the drain region can be formed up to near the bottom portion of the gate electrode 2.

In this way, in the present variation, even when ion implantation down to near the bottom portion of the gate electrode 2 is difficult, the source region and the drain region can be formed by the second wells 21 and 22.

It is to be noted that, although the semiconductor device 20 is an n-channel semiconductor device, it may be a p-channel semiconductor device. In that case, the well 5 is formed to be of an n-type, the second wells 21 and 22 are formed to be of a p-type, and p+ regions, which are high concentration p-type regions, are formed on the second wells 21 and 22.

In the semiconductor device 20 described in the above, a bottom portion side of the source region and the drain region is formed by the well 5 of a second conductivity type (Here, because the semiconductor device 20 is an n-channel semiconductor device, the well 5 is of an n-type. When the semiconductor device 20 is a p-channel semiconductor device, the well 5 is of a p-type).

(Variation 2)

In the present variation, another method of forming second wells which work as a source region and a drain region is described.

While, in Variation 1, the mask is formed with the resist 23 in the region where the gate electrode 2 is to be formed, and the second wells 21 and 22 are individually formed, in the present variation, by forming a single second well and separating the single second well, second wells corresponding a source region and a drain region, respectively, are formed.

Figure 4:
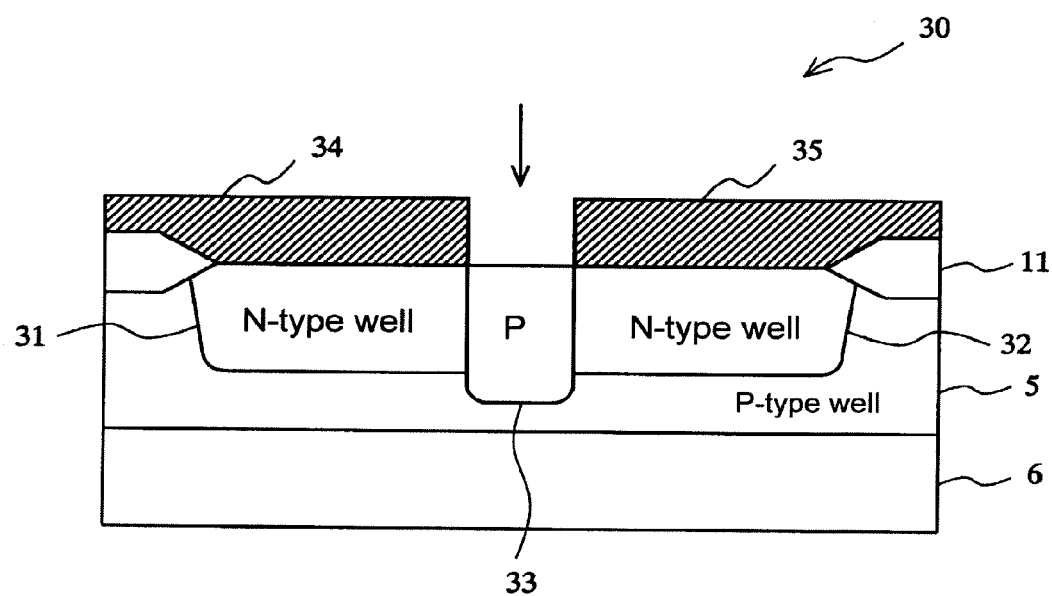
FIG. 4 is a view for explaining a method of manufacturing a semiconductor device according to Variation 2.

The method of forming the second wells is described in the following with reference to FIG. 4.

After LOCOS 11 and a p-type well 5 are formed on a semiconductor substrate 6, ions are implanted into an upper surface of the well 5 and heat treatment is carried out to form a single n-type second well. The single second well is formed in a second well 31, a second well 32, and a region between the wells illustrated in FIG. 4.

Then, masks are formed with resists 34 and 35 on the regions where the second wells 31 and 32 are formed to expose a surface where a gate electrode 2 is formed.

In this state, ions such as boron are implanted. The exposed region which is of the n-type is converted to p-type and a p-type region 33 is formed. A bottom portion of the p-type region 33 is set to be deeper than a bottom portion of the single second well, which divides the single second well into the second well 31 and the second well 32.

Process after the second well 31 and the second well 32 are formed is similar to that of Variation 1.

Figure 5:
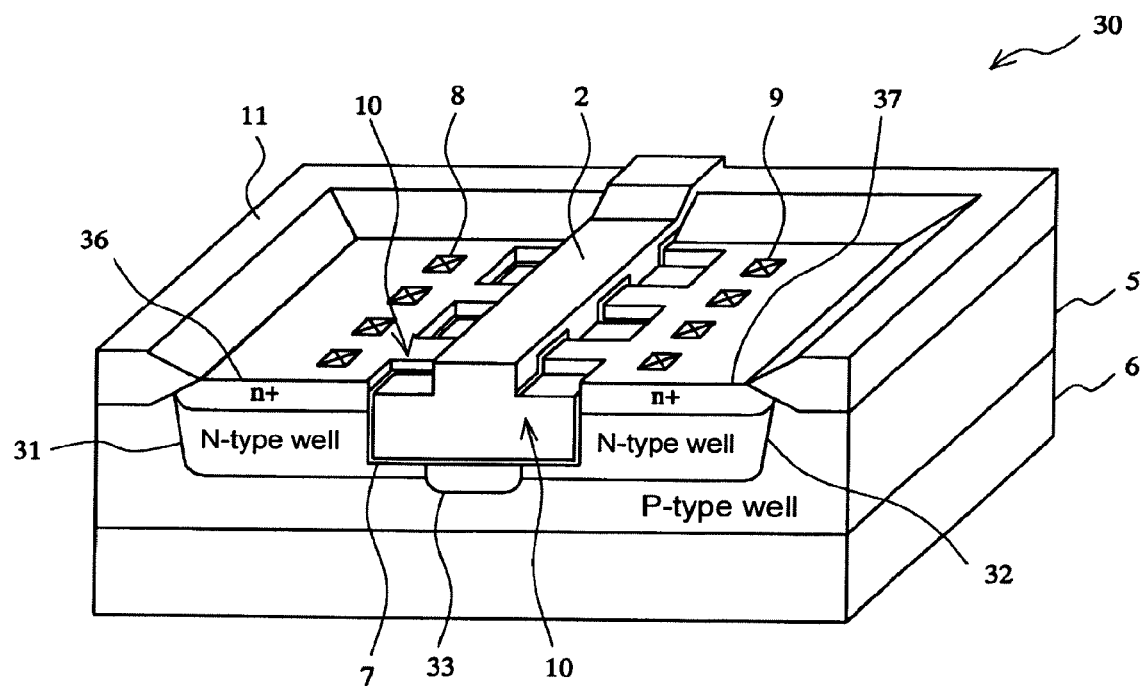
FIG. 5 is a view for explaining a structure of the semiconductor device according to Variation 2.

FIG. 5 is a view for explaining a structure of a semiconductor device according to Variation 2.

In a semiconductor device 30, ions are implanted into upper surfaces of the second wells 31 and 32, an n+ region 36 is formed on the second well 31, and an n+ region 37 is formed on the second well 32. Contacts 8 are formed in the n+ region 36 while contacts 9 are formed in the n+ region 37.

The second well 31 and the n+ region 36 as a whole work as a source region while the second well 32 and the n+ region 37 as a whole work as a drain region.

Trench portions 10 are formed in the p-type region 33 which divides the single second well, and the gate electrode 2 is formed via an insulating film 7.

In this way, when ion implantation up to near a bottom portion of the gate electrode 2 is difficult, by forming the single second well up to near the bottom portion of the gate electrode 2 and dividing the single second well into two, the source region and the drain region can be formed.

When the single second well is also formed below the trench portions 10 in this way, the p-type region is formed immediately below the trench portions 10.

(Variation 3)

In the present variation, by providing an electric field alleviating region in a drain region, a withstand voltage of a semiconductor device is improved.

Figure 6:
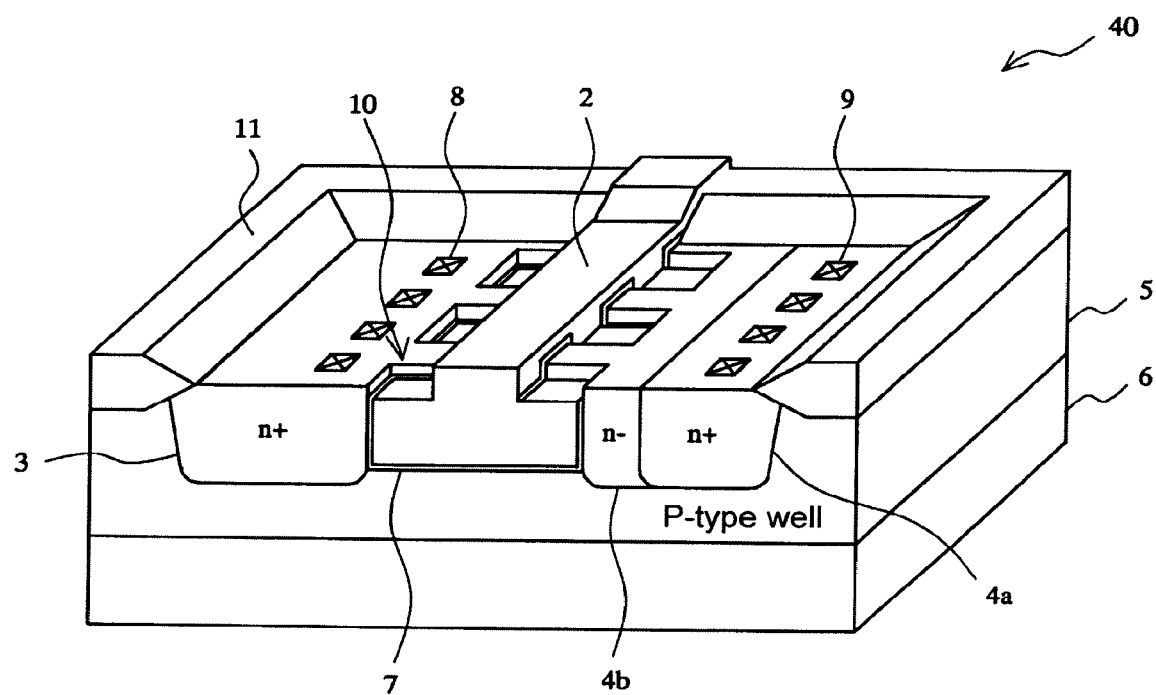
FIG. 6 is a view for explaining a structure of a semiconductor device according to Variation 3.

FIG. 6 is a view for explaining a structure of a semiconductor device according to the present variation.

In a semiconductor device 40, an n− region 4b where the concentration of the n-type is low is provided in a drain region 4 of the above-mentioned semiconductor device 1 (FIG. 1) on the side facing a gate electrode 2. The n− region 4b is formed up to near a bottom portion of the gate electrode 2.

An n+ region 4a where the concentration of the n-type is high has an n-type concentration which is similar to that of the drain region 4 of the semiconductor device 1 (FIG. 1), and contacts 9 are formed therein.

The structure on the side of a source is the same as that of the semiconductor device 1.

The concentration difference can be formed by, for example, forming the whole drain region so as to have a concentration of n−, and after that, forming a mask on the n-region 4b and implanting ions into the n+ region 4a.

More specifically, in the semiconductor device 40, the impurity concentration of the portion of the drain region which is adjacent to the gate electrode 2 is set to be low.

In this way, by forming the region where the concentration of the n-type is low between the gate electrode 2 and the n+ region 4a, an electric field is alleviated by the region to improve the withstand voltage of the semiconductor device 40.

(Variation 4)

In the present variation, also, by providing an electric field alleviating region in a drain region, a withstand voltage of a semiconductor device is improved.

Figure 7:
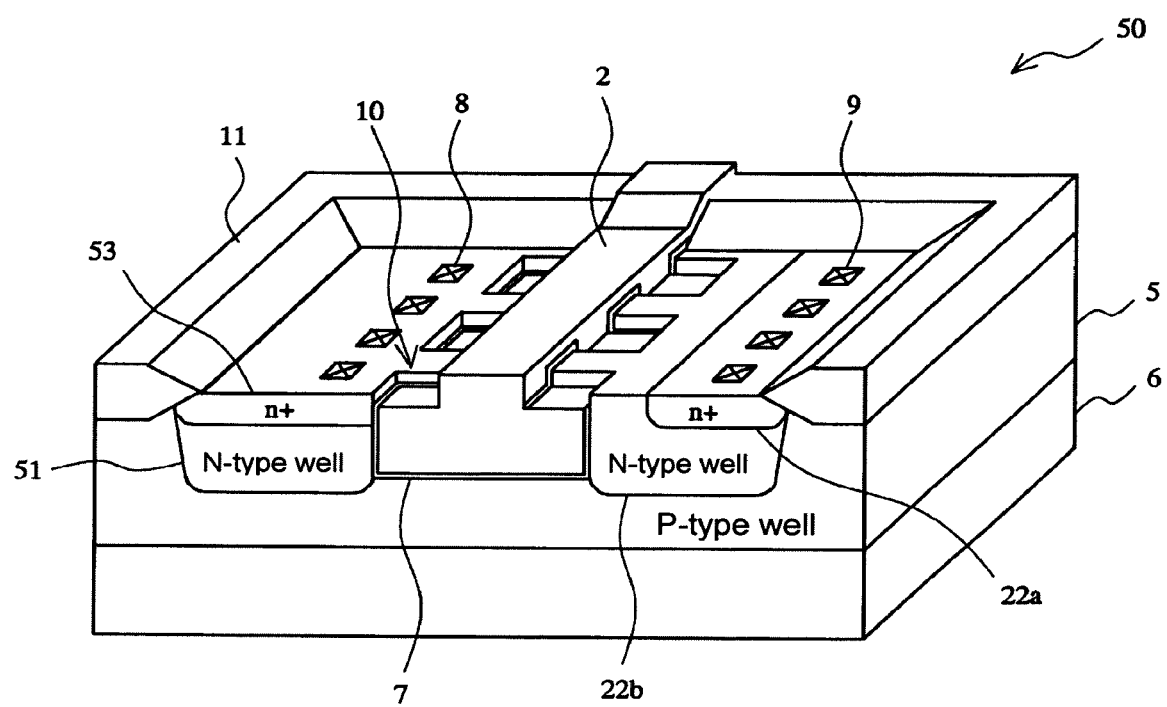
FIG. 7 is a view for explaining a structure of a semiconductor device according to Variation 4.

FIG. 7 is a view for explaining a structure of a semiconductor device according to the present variation.

In a semiconductor device 50, an n+ region 22a where the concentration of the n-type is high is formed in a drain region of the above-mentioned semiconductor device 20 (FIG. 3) in Variation 2 on the side of contacts 9 and an N-type well 22b where the concentration of the n-type is low is formed on the side facing a gate electrode 2.

After the N-type well is formed as a second well in the drain region, ions are implanted into an upper surface of a region where the n+ region 22a is to be formed to form the n+ region 22a. The contacts 9 are formed in the n+ region 22a. The concentration of the n-type in the n+ region 22a is similar to that in the drain region 4 (FIG. 1).

The structure on the side of a source is the same as that of the semiconductor device 20.

In this way, by forming the region where the concentration of the n-type is low between the gate electrode 2 and the n+ region 22a, an electric field is alleviated by the region to improve the withstand voltage of the semiconductor device 50.

What is claimed is:

1. A semiconductor device, comprising:
    a semiconductor substrate;
    a well of a first conductivity type which is formed on the semiconductor substrate, the well having a concave portion formed therein with varying depth in a gate width direction, a first flat portion extending away laterally from the concave portion in a first direction, and a second flat portion extending away from the concave portion in a second direction that is opposite to the first direction;
    a gate electrode formed on an upper surface and inside of the concave portion via an insulating film, the gate electrode filling all of the concave portion;
    a source region of a second conductivity type disposed on one side of the gate electrode and on the first flat portion, wherein the first flat portion is at least as deep into the well as a bottom surface of the gate electrode relative to an uppermost portion of the well, and wherein all of the source region has a uniform thickness in a longitudinal direction and a flat surface in a lateral direction; and a drain region of the second conductivity type disposed on another side of the gate electrode and on the second flat portion, wherein the second flat portion is at least as deep into the well as he bottom surface of the gate electrode relative to the uppermost portion of the well. and wherein all of the drain region having a uniform thickness in the longitudinal direction and a flat surface in the lateral direction.

2. A semiconductor device according to claim 1, wherein the first flat portion is deeper than the bottom surface of the gate electrode relative to the uppermost portion of the well.

3. A semiconductor device according to claim 1, wherein a bottom portion side of the source region and the drain region is formed by a well of the second conductivity type.

4. A semiconductor device according to claim 1, wherein an impurity concentration of a portion of the drain region which is adjacent to the gate electrode is set to be low.

5. A semiconductor device, comprising:

a semiconductor substrate;

a first well of a first conductivity type which is formed on the semiconductor substrate, the well having a concave portion formed therein with varying depth in a gate width direction, a first flat portion extending away laterally from the concave portion in a first direction, and a second flat portion extending away from the concave portion in a second direction that is opposite to the first direction;

a gate electrode formed on an upper surface and inside of the concave portion via an insulating film, the gate electrode filling all of the concave portion;

a second well of a second conductivity type disposed on either side of the gate electrode and under a bottom portion of the gate electrode, the second well being divided into two parts by a first conductivity type region under the bottom portion of the gate electrode;

a source region of the second conductivity type disposed on one side of the gate electrode and on the first flat portion to connect with one of the two parts divided from the second well, wherein all of the source region has a uniform thickness in a longitudinal direction and a flat surface in a lateral direction; and a drain region of the second conductivity type disposed on another side of the gate electrode and on the second flat portion to connect with another of the two parts divided from the second well, wherein all of the drain region having a uniform thickness in the longitudinal direction and a flat surface in the lateral direction.

* * * * *